(12) United States Patent
Strauss et al.

(10) Patent No.: US 8,253,026 B2
(45) Date of Patent: Aug. 28, 2012

(54) PRINTED CIRCUIT BOARD

(75) Inventors: Steffen Strauss, Regensburg (DE);
Michael Weis, Munich (DE)

(73) Assignee: OSRAM AG, Munich (DE)

( * ) Notice: Subject to any disclaimer, the term of this patent is extended or adjusted under 35 U.S.C. 154(b) by 319 days.

(21) Appl. No.: 12/414,780

(22) Filed: Mar. 31, 2009

(65) Prior Publication Data

US 2009/0301765 A1 Dec. 10, 2009

(30) Foreign Application Priority Data

Mar. 31, 2008 (DE) .................. 10 2008 016 458

(51) Int. Cl.
*H05K 7/20* (2006.01)

(52) U.S. Cl. ............... 174/252; 361/679.54; 361/704; 361/707; 361/719

(58) Field of Classification Search .............. 174/16.3, 174/252, 254–266; 361/679.46, 679.54, 361/704, 707–712, 717, 19, 720, 721; 165/80.3, 165/104.33, 185; 257/99, 75, 103, 88, 725, 257/728, 713–718; 362/227, 294, 373, 555, 362/487, 543–545, 382, 396, 800, 249, 548, 362/547

See application file for complete search history.

(56) References Cited

U.S. PATENT DOCUMENTS

| | | | | |
|---|---|---|---|---|
| 4,742,432 A | * | 5/1988 | Thillays et al. ............... | 361/783 |
| 5,459,639 A | * | 10/1995 | Izumi ............... | 361/707 |
| 5,617,294 A | * | 4/1997 | Watson et al. ............... | 361/719 |
| 5,708,566 A | * | 1/1998 | Hunninghaus et al. ....... | 361/704 |
| 6,295,200 B1 | * | 9/2001 | Schmidt ............... | 361/704 |
| 6,411,516 B1 | * | 6/2002 | Palumbo et al. ............... | 361/704 |
| 6,562,643 B2 | * | 5/2003 | Chen ............... | 438/26 |
| 6,818,477 B2 | * | 11/2004 | Veitschegger et al. ....... | 438/122 |
| 6,832,861 B2 | | 12/2004 | Kragl | |
| 6,922,339 B2 | * | 7/2005 | Nakamura et al. ............... | 361/719 |
| 6,966,674 B2 | * | 11/2005 | Tsai ............... | 362/294 |
| 7,285,802 B2 | * | 10/2007 | Ouderkirk et al. ............... | 257/98 |
| 7,411,224 B2 | * | 8/2008 | Kim et al. ............... | 257/99 |
| 7,505,275 B2 | * | 3/2009 | Reis et al. ............... | 361/717 |
| 7,679,918 B2 | * | 3/2010 | Kim ............... | 361/719 |
| 7,794,121 B2 | * | 9/2010 | Melzner ............... | 362/362 |
| 2005/0180111 A1 | | 8/2005 | Bamesberger et al. | |
| 2006/0023432 A1 | | 2/2006 | Hockel et al. | |
| 2006/0049475 A1 | * | 3/2006 | Wang et al. ............... | 257/432 |
| 2006/0180821 A1 | | 8/2006 | Fan et al. | |
| 2006/0232969 A1 | | 10/2006 | Bogner et al. | |
| 2007/0007558 A1 | * | 1/2007 | Mazzochette ............... | 257/239 |
| 2007/0081342 A1 | * | 4/2007 | Szeto ............... | 362/294 |
| 2007/0268703 A1 | * | 11/2007 | Gasquet et al. ............... | 362/294 |
| 2008/0191231 A1 | * | 8/2008 | Park et al. ............... | 257/98 |

(Continued)

FOREIGN PATENT DOCUMENTS

DE 4100145 A1 7/1991

(Continued)

OTHER PUBLICATIONS

English translation of abstract of DE 20 2004 006 870 U1.

(Continued)

*Primary Examiner* — Michail V Datskovskiy

(57) ABSTRACT

A printed circuit board is provided with at least one via hole, in which a heat dissipating element is arranged, wherein at least one radiant source is arranged on the heat dissipating element. The lighting device is provided with at least one such printed circuit board.

22 Claims, 6 Drawing Sheets

U.S. PATENT DOCUMENTS

2009/0052146 A1    2/2009  Busch et al.

FOREIGN PATENT DOCUMENTS

| DE | 4208604 A1 | 6/1993 |
| --- | --- | --- |
| DE | 10065624 A1 | 7/2002 |
| DE | 10210041 A1 | 10/2003 |
| DE | 10245892 A1 | 5/2004 |
| DE | 10329267 A1 | 1/2005 |
| DE | 202004006870 U1 | 7/2005 |
| DE | 102004059986 A1 | 9/2005 |
| DE | 102004036960 A1 | 3/2006 |
| DE | 102006034425 A1 | 2/2007 |
| DE | 102005047025 A1 | 4/2007 |
| DE | 102006004320 A1 | 8/2007 |

OTHER PUBLICATIONS

English abstract of DE 10 2006 034 425 A1.
English translation of abstract of DE 10 2006 004 320 A1.
English abstract of DE 103 29 267 A1.
English abstract of DE 102 10 041 A1.
English abstract of DE 42 08 604 A1.
English abstract of DE 41 00 145 A1.

* cited by examiner

US 8,253,026 B2

PRINTED CIRCUIT BOARD

CROSS-REFERENCE TO RELATED APPLICATIONS

This application claims priority to German Patent Application No. 10 2008 016 458.5, filed Mar. 31, 2008. The complete disclosure of the above-identified application is hereby fully incorporated herein by reference.

TECHNICAL FIELD

The invention relates to a printed circuit board provided with at least one radiant source, particularly a light emitting diode, and to a lighting device with at least one such printed circuit board.

BACKGROUND

It is commonly known to provide printed circuit boards with heat conducting plated through holes, so called "thermal vias". Thermal vias improve the heat transmission perpendicular to the printed circuit board. The thermal conductivity of cost-efficient basis materials, such as FR4 with 0.3 W/mK, is regarded as being too marginal for a cooling of electronic components. The primary objective of using thermal vias is an improvement of thermal conductivity; they utilize the high heat conductance value (300 W/mK) of copper, the material of a typical plated through hole. By means of a dense arrangement, for example having a hexagonal raster of 0.5 mm and a diameter of the vias of 0.25 mm, up to 10% of copper may be effectively realized in the printed circuit board. From this follows a thermal conductivity of 30 W/mK perpendicular to the printed circuit board. It is also commonly known to provide printed circuit boards with a metal core and thick copper allowing for a higher lateral thermal conductivity. For this, copper or aluminum sheets or copper layers strengthened up to 400 µm are included in the printed circuit board. In conjunction with a print of heat conducting paste a heat reduction may thus be achieved and in certain cases the application of additional heat sinks may be avoided, if the generation of heat by the electronic components does not become too high.

DE 20 2004 006 870 U1 discloses a electrical printed circuit board comprised of at least one dielectric supporting layer and a conductive pattern attached at least on one side thereof representing a electrical circuit with at least one laminary heat conducting block (heat sink) inserted into a continuous recess of the supporting layer and consisting of a metallic substance, which comprises at least one heat conducting contact with the conductive pattern and whose front faces substantially extend flush with the levels of the top side as well as the lower side of the printed circuit board, characterized in that at least one front face of the heat conducting block is coated with a surface metallization layer extending beyond the boundary of the recess, that the inner walls of the recess are evenly coated with a metallization layer and that the heat conducting block comprises at least one heat conducting contact with this metallization layer.

LED light sources (such as LED chips or a LED submount) and if applicable respective electronic components (such as driver components), due to their high heat development, heretofore are simultaneously electronically connected to a printed circuit board and thermally connected to a cooling system. In order to connect to the cooling system the printed circuit board for the most part is provided with a large area heat sink on its back side. However, such solutions are comparably inefficient and large in volume.

SUMMARY

According to various embodiments, a possibility for an effective and space saving cooling of radiant sources, in particular light emitting diodes, can be provided which are to be arranged on a printed circuit board. Preferably, also the heat of electronic components on the printed circuit board is to be dissipated effectively and in a space saving manner.

According to an embodiment, a printed circuit board may comprise at least one via hole, in which a heat dissipating element is arranged, wherein at least one radiant source is arranged on the heat dissipating element.

According to a further embodiment, the heat dissipating element can be electrically conductive and may be separated from the at least one radiant source by means of a heat conducting as well as electrically insulating layer. According to a further embodiment, the heat conducting as well as electrically insulating layer can be formed as a submount for the at least one radiant source. According to a further embodiment, the submount may be force fitted into the heat dissipating element. According to a further embodiment, the heat dissipating element may comprise a heat conducting as well as a electrically insulating material. According to a further embodiment, the at least one radiant source can be mounted directly onto the heat dissipating element. According to a further embodiment, the radiant source may comprise at least one light emitting diode. According to a further embodiment, the radiant source may comprise at least one group of light emitting diodes. According to a further embodiment, the printed circuit board may be realized with multiple layers. According to a further embodiment, at least one conductor path of at least one layer may contact the heat dissipating element. According to a further embodiment, the conductor path contacted with the heat dissipating element can be connected to an outer side of the printed circuit board by means of at least one heat conducting plated through hole. According to a further embodiment, the printed circuit board can be designed such that at least one conductor path of at least one layer does not contact the heat dissipating element. According to a further embodiment, the conductor path not contacting the heat dissipating element can be realized with a large area. According to a further embodiment, the printed circuit board can be designed such that at least one conductor path of at least one layer does not contact the heat dissipating element and wherein a conductor path not contacting the heat dissipating element and a conductor path contacting the heat dissipating element have a marginal distance. According to a further embodiment, the printed circuit board can be designed such that a distance between a conductor path not contacting the heat dissipating element and a adjacent conductor path contacting the heat dissipating element does not exceed 250 µm. According to a further embodiment, the printed circuit board can be designed such that a distance between a conductor path not contacting the heat dissipating element and a adjacent conductor path contacting the heat dissipating element does not exceed 200 µm. According to a further embodiment, the printed circuit board can be designed such that a distance between a conductor path not contacting the heat dissipating element and a adjacent conductor path contacting the heat dissipating element does not fall below 25 µm. According to a further embodiment, the printed circuit board can be designed such that a distance between a conductor path not contacting the heat dissipating element and a adjacent conductor path contacting the heat dissipating element does not fall below 50 μm. According to a further embodiment, the printed circuit board can be designed such that a thickness of a conductor path does not exceed 250 μm in particular does not exceed 200 μm. According to a further embodiment, a conductor path contacting the heat dissipating element can be designed isolated. According to a further embodiment, the heat conducting plated through hole contacting the conductor path designed isolated can be covered by a housing of a electronic component at the outer layer. According to a further embodiment, a conductor path not contacting the heat dissipating element can be designed to be connected to an electrical potential. According to a further embodiment, a conductor path not contacting the heat dissipating element can be connected to a electrical terminal of a electronic component via at least one electrically and thermally conductive plated through hole. According to a further embodiment, the heat dissipating element may contact a wall of the associated plated through hole. According to a further embodiment, the heat dissipating element can be force fitted into the associated plated through hole. According to a further embodiment, the heat dissipating element may have a height corresponding to the height of the printed circuit board. According to a further embodiment, the heat dissipating element can be thermally contactable with a cooling system. According to a further embodiment, the heat dissipating element can be thermally contactable with the cooling system at a face averted to the at least one radiant source.

According to another embodiment, a lighting device can be provided with at least one such printed circuit board as described above.

BRIEF DESCRIPTION OF THE DRAWINGS

In the following Figures the invention is schematically described in more detail by means of exemplary embodiments. In doing so, similar or similarly acting elements may be annotated with equal reference numerals for better clarity. The elements shown may not necessarily be plotted true to scale.

DETAILED DESCRIPTION

Figure 1A:
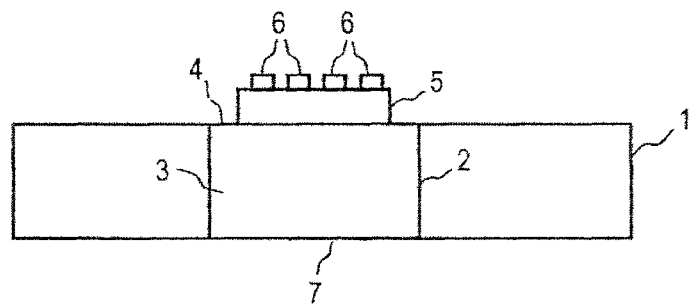
FIG. 1A shows a drawing of a printed circuit board with a heat dissipating element as a sectional view in lateral view.

The printed circuit board has at least one via hole in which a heat dissipating element ("inlay") well conducting heat is arranged, for example a block of metal, in particular copper. The hole may be completely or only partially encompassed by the printed circuit board laterally. At least one radiant source is arranged on a top side or a lower side end face of the heat dissipating element. The radiant source may for example emit visible light and/or infrared radiation.

A material or an element well conducting heat is considered to be a material or a combination of materials or an element, respectively, which exhibits a heat conducting coefficient $\lambda$ of more than about 15 W/mK. It is particularly preferred if the heat conducting coefficient amounts to 175 W/mK or more, especially more than 215 W/mK and most preferred more than about 300 W/mK, especially more than about 350 W/mK. The material may comprise a metal or a metal alloy, for example comprising Al, Cu, Ag and I or Au, or a metalloid, such as a AlN ceramics or also small carbon nano fibers.

In such a printed circuit board a efficiently heat dissipating and compact area is established by the heat dissipating element. A cooling system, for example a heat sink or a heat pipe, thermally coupled to the respective opposite end faces of the heat dissipating element may absorb and dissipate a correspondingly high and locally limited thermal flow.

A printed circuit board is preferred, in which the heat dissipating element comprises a thermal contact with a cooling system, particularly comprises a thermal contact with one of the at least one faces of the heat dissipating element averted to the radiant source, for example by means of mechanical contacting.

The cooling system may operate actively and/or passively. For example, for a active cooling a ventilator or another air flow producing device may be used. For a passive cooling a heat sink with cooling fins or a heat pipe may be used for example. The heat sink may be manufactured separately from or integral with the heat dissipating element. Preferably, the heat sink is thermally coupled to the heat dissipating element only, but may also be laterally extended above with its cooling fins. Combinations of cooling elements are possible. Generally, all qualified natures of heat dissipation may be used, for example also a water cooling system.

For a fixed and warp resistant attachment as well as for a even better thermal connection to the printed circuit board it is preferred that the heat dissipating element is contacting a wall of the respective via hole, in particular contacting continuously in circumferential direction. Preferably, the via hole is metalized on its side faces for better electrical and thermal connection.

Alternatively, one or multiple wall sections may not be contacted, for example for electrical isolation towards the printed circuit board; for example, the heat dissipating element may be bolted down on to the lower side of the printed circuit board.

For a simple integration with a particularly fixed position it is preferred that the heat dissipating element is force fitted into the corresponding via hole. This proves to be particularly advantageous, if a wire bonding is used for contacting the radiant source(s) with the printed circuit board.

It is further preferred that the heat dissipating element has a height corresponding to the height of the printed circuit board.

It may be preferred that the heat dissipating element is electrically conductive and is separated from the at least one radiant source by means of a heat conducting as well as also electrically isolating layer (herein as the "heat conducting layer").

It is then particularly preferred, if the heat conducting layer (TIM; thermal interface material) is carried out as a submount for the at least one radiant source.

For a simple attachment it may further be preferred, if the submount is force fitted into the heat dissipating element.

The heat dissipating element may preferably comprise a good heat conducting as well as also electrically isolating material, for example AlN or another ceramics. Preferred then is a printed circuit board, in which the at least one radiant source is attached directly onto the heat dissipating element, for example using an adhesive or a reflow soldering procedure.

The radiant source preferably comprises at least one light emitting diode. The radiant source may for example be a LED module comprising one light emitting diode or multiple light emitting diodes, for example comprising one light emitting diode as part of a LED chip. The light emitting diodes may each emit single colored or multiple colored light, for example white light. An infrared light emitting light emitting diode may also be used. If multiple light emitting diodes are present, these may for example be of the same color (single colored or multiple colored) and/or may illuminate with different colors. As such, a LED module may comprise multiple single LEDs ("LED cluster"), which together may result in a white mixture of light, for example "cold white" or "warm white". In order to generate a white mixture of light the LED cluster preferably comprises light emitting diodes illuminating in the elementary colors red (R), green (G) and blue (B). In doing so, single or multiple colors may also be generated by multiple LEDs simultaneously; as such combinations like RGB, RRGB, RGGB, RGBB, RGGBB and so on may be used.

However, the color combination is not limited to R, G and B. For example, in order to generate a warm white hue also one or multiple amber colored LEDs (A) may be used. When using LEDs with different colors these may be controlled such that the LED module illuminates with a variable RGB color scale. In order to generate a white light from a mixture of blue light with yellow light, blue LED chips provided with fluorescent substance may also be used, for example using surface mount technology, for example Thin-GaN-Technology. Further, a LED module may also comprise multiple white singular chips, whereby a simple scaling of the luminous flux can be achieved. The single chips and/or the modules may be provided with appropriate optics for beam guiding, for example Fresnel lenses, collimating lenses and so on. Multiple uniform or different LED modules may be arranged at a contact, for example multiple uniform LED modules on the same substrate. Instead of or in addition to an organic light emitting diodes, for example on the basis of InGaN or AlInGaP, in general organic LEDs (OLEDs) may also be commonly used. Also, other semiconductor radiant sources, such as diode lasers, may be used for example.

Preferably, the printed circuit board is formed with multiple layers, in particular if at least one conductor path of at least one layer contacts the heat dissipating element. This way heat dissipation also is accomplished from other components attached to the printed circuit board, for example electronic devices. To do this it is further preferred, if the conductor path contacted to the heat dissipating element is connected to an outer layer of the printed circuit board by means of at least one heat conducting plated through hole. For cooling it may be further preferred, if at least one conductor path of at least one layer does not contact the heat dissipating element. Thereby in particular components connectable to a voltage potential may be cooled effectively.

In order to spread heat and to thereby intensify heat dissipation the conductor path (loaded with a electrical potential) not contacting the heat dissipating element is implemented with a large area, i.e. with an area larger than that of a conductor path commonly operating only electrically. In order to also dissipate heat effectively from layers not contacting the heat dissipating element it is preferred, if a conductor path not contacting the heat dissipating element and a adjacent conductor path contacting the heat dissipating element have a small distance to each other which nevertheless allows for a sufficient electrical isolation.

To this end it is particularly preferred, if a distance between a conductor path not contacting the heat dissipating element and a adjacent conductor path contacting the heat dissipating element does not exceed 250 μm, in particular does not exceed 200 μm.

Furthermore it is particularly preferred, if a distance between a conductor path not contacting the heat dissipating element and a adjacent conductor path contacting the heat dissipating element does not fall below 25 μm, in particular does not fall below 50 μm.

For an easier interpretation it may be particularly preferred, if a (vertical) distance between a conductor path layer not contacting the heat dissipating element and a adjacent conductor path layer contacting the heat dissipating element does not exceed 250 μm, particularly does not exceed 200 μm, and/or a (vertical) distance between a conductor path layer not contacting the heat dissipating element and a adjacent conductor path layer contacting the heat dissipating element layer does not fall below 25 μm, in particular does not fall below 50 μm.

It is further preferred, if a thickness of a conductor path does not exceed 250 μm, in particular a thickness of a conductor path does not exceed 200 μm.

It is preferred, if a conductor path contacting the heat dissipating element is configured isolated.

In order to achieve a particularly effective heat dissipation it is furthermore preferred, if a heat conducting plated through hole contacting the conductor path configured isolated is covered by a housing of a electronic component at the outer layer.

A conductor path not contacting the heat dissipating element preferably is connected to a voltage potential during operation.

It is preferred, if a conductor path not contacting the heat dissipating element is connected to a electrical connection of a electronic component via at least one electrically and thermally conductive plated through hole. The lighting device comprises at least one such printed circuit board.

FIG. 1A shows as a sectional view in lateral view a drawing of a printed circuit board 1 with FR4 as a base material. All the way through the height a via hole 2 with a cross-sectional shape of a square (top view from above or below, respectively) with chamfered corners is arranged in the printed circuit board 1, for example by milling out. The via hole 2 is completely filled by means of a heat dissipating element 3 ("inlay") from copper. The heat dissipating element 3 is force fitted into the via hole 2 and continuously contacts the wall of the via hole, i.e. completely circumferential. The height of the heat dissipating element 3 corresponds to the height of the printed circuit board 1.

The top surface 4 of the heat dissipating element 3 is equipped with a submount 5 of AlN ceramics, which carries multiple light emitting diodes 6 as a radiant source (LED module). The light emitting diodes 6 are attached to the submount 5 by means of a heat conducting adhesive paste. The lower surface 7 of the heat dissipating element 3 may be thermally coupled to a cooling system, for example to a compact heat sink (not shown), which bears on the lower surface 7 mainly or completely.

This printed circuit board 1 shows the advantage over conventional printed circuit boards that the heat generated by the LEDs 6 may be dissipated effectively via a small volume.

Figure 1B:
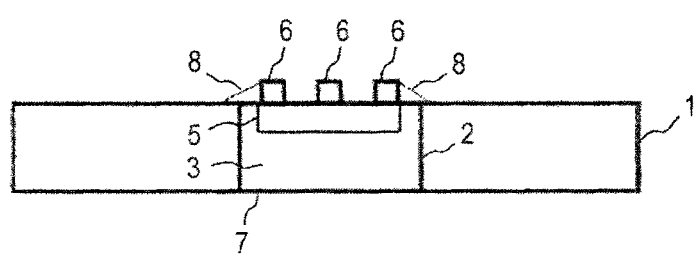
FIG. 1B shows a drawing of a printed circuit board with a heat conducting element according to a further embodiment as a sectional view in lateral view.

According to FIG. 1B the submount 5 is now force fitted into the heat dissipating element 3 existent as a block of copper. Thereby a overall height is reduced and a heat dissipation ability is further improved. Shown here now are as well the electrical contactings of the LEDs 6 via bond wires 8 with bond pads (not shown) on the top outer layer of the printed circuit board 1. Submount 5 may for example consist of a metal core circuit board or may comprise a one layer or a multi layer structured ceramics, for example a AlN ceramics. By force fitting the advantage results that no adhesion procedure is necessary. Alternatively, submount 5 and circuit board 1 may be soldered together for example.

FIG. C shows a printed circuit board 1, where the heat dissipating element 9 now is completely produced from thermally well conducting and electrically insulating material, for example AlN. The LEDs 6 may be attached directly onto such a heat dissipating element 9, i.e. without an electrically insulating intermediate layer, for example by means of bonding or a reflow procedure.

Figure 1C:
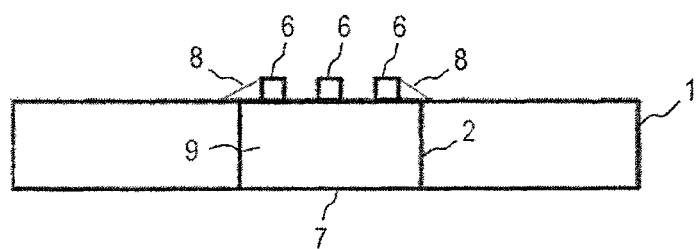
FIG. 1C shows a drawing of a printed circuit board with a heat conducting element according to another further embodiment as a sectional view in lateral view.
Figure 1D:
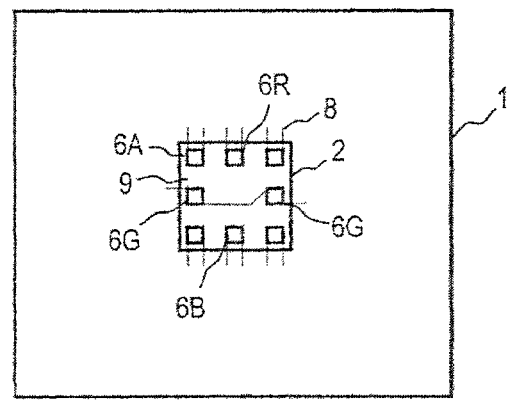
FIG. 1D shows the printed circuit board of FIG. 1C in top view.

FIG. 1D shows the printed circuit board 1 of FIG. 1C in top view. The hole 2 is carried out with a quadratic cross-sectional form without chamfered corners here. Eight LEDs 6 are attached to the heat dissipating element 9 in form of a 3×3 matrix, wherein the central position is left unoccupied. The inner positions are mounted with colored radiating LEDs, that is to say in this representation with a red radiating LED 6R at the top, a blue radiating LED 6B at the bottom, and two green radiating LEDs 6G electrically connected in series via a bonding wire 8 on the left and on the right. These LEDs 6R, 6G, 6B may together result in a cold white mixture of light. In order to also produce a warm white mixture of light, amber illuminating LEDs 6A exist at the four corner positions. The central position may be populated by a brightness or color sensor.

Figure 2A:
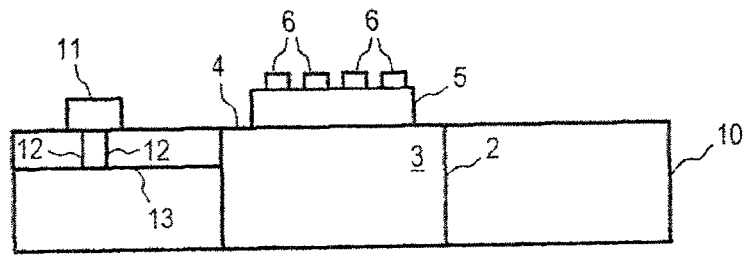
FIG. 2A shows a printed circuit board according to a further embodiment with a heat conducting element according to FIG. 1A.

FIG. 2A shows a printed circuit board 10 similar to the embodiment of FIG 1A which is now carried out with multiple layers. Electronic modules 11 to be cooled (zu entwärmende) are attached lateral to the heat dissipating element (block of copper) 3 on the top surface (outer layer) of the printed circuit board 10, for example a driver circuit, resistors, capacitors and so on. These rest on heat conducting copper plated through holes ("thermal vias") 12, which lead to a large area copper conductor path 13. In this case the electronic modules 11 need not contact the thermal vias 12 in order to allow for an effective heat transfer, in most cases the transfer of thermal radiation is sufficient. However, also a force fitted contacting or an adhesive connection may be allowed for. A heat spreading by the large area copper conductor path 13 already leads to a high heat dissipation from the electronic component 11. In the embodiment shown here the conductor path 13 all the way to the via hole 2 is sufficient and therefore is laterally connected to the heat dissipating element 3, which results in a further increase of heat dissipation. This type of heat dissipation is particularly suitable for isolated leads. This embodiment has the advantage that further components on the circuit board 1 may be thermally connected to the heat dissipating element (inlay) 3.

Figure 2B:
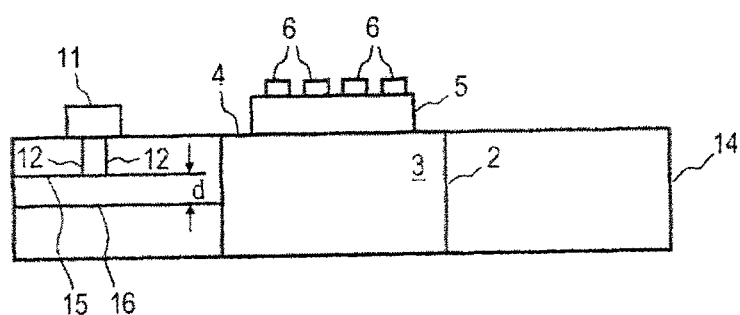
FIG. 2B shows a printed circuit board according to yet another further embodiment with a heat conducting element according to FIG. 1A.

FIG. 2B shows a printed circuit board 14 similar to the one of FIG. 2A, where the now two layers or conductor paths 15, 16, respectively, are spaced by a distance d in the direction of height. The thermal vias 12 are connected to contact tabs (not shown) on the outer layer of the printed circuit board 14 and provide a thermal and electrical connection to a conductor path 15, which does not extend all the way to the heat dissipating element 3 and advantageously is electrically insulated therefrom. By means of the electrical insulation the conductor path 15 is especially suited to be connected to a voltage potential. The spreading of heat in the large area copper conductor path 15 results in a high heat dissipation of the electronic component 11. In order to amplify the heat dissipation the distance d between the conductor path 15 connected to a electrical potential and a isolated conductor path 16 connected to the heat dissipating element 3 is such small, that this results in a significant heat transfer from the conductor path 15 to the conductor path 16 via the intermediate electrically insulating FR4 substrate material. Here, the conductor path 16 hence solely serves a heat dissipation and may for example be applied across the whole surface.

Figure 2C:
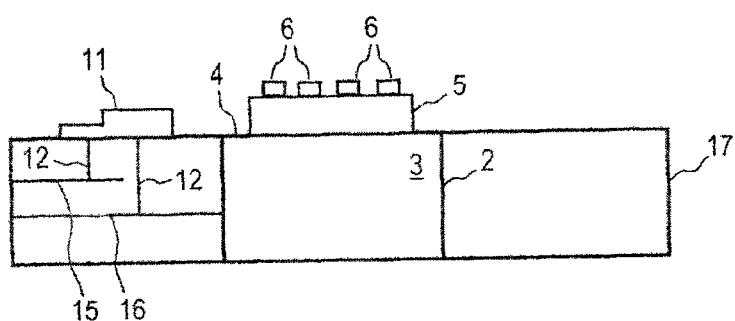
FIG. 2C shows a further printed circuit board according to yet another further embodiment with a heat conducting element according to FIG. 1A.

FIG. 2C shows yet a further multi layer printed circuit board 17 similar to the one of FIG. 2A, where the thermal vias 12 now connect a component 11 to a conductor path or conductor area 15 loaded with a electrical potential, wherein then a simultaneous electrical connection is preferred. At the same time the component 11 is connected to the isolated conductor path 16 and further to the heat dissipating element 3 via thermal vias 12. The isolated conductor path 16 consequently dissipates heat fed via the thermal vias 12 as well as dissipates heat fed by means of convection via large area heat transfer from the conductor path 15 loaded with a electrical potential via the conductor path base material FR4. This embodiment has the advantage that all of the area (isolated and loaded with a electrical potential) of the component 11 may be connected to the printed circuit board for cooling.

Figure 2D:
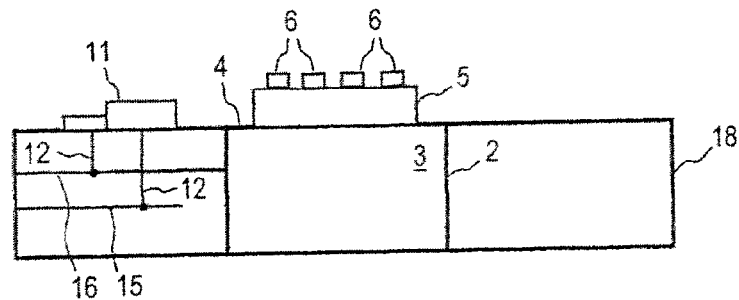
FIG. 2D shows a further printed circuit board according to yet another further embodiment with a heat conducting element according to FIG. 1A.

FIG. 2D shows yet a further multi layer printed circuit board 18 similar to the one of FIG. 2C, where now the order of the conductor paths 15, 16 is reversed. Here, the thermal vias 12 loaded with a electrical potential are realized insulated by means of the isolated conductor path 16, as is described in more detail further below.

Figure 3A:
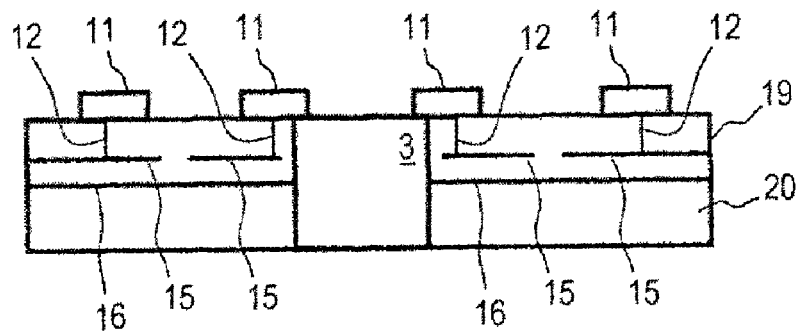
FIG. 3A shows a further printed circuit board according to yet another further embodiment with a heat conducting element according to FIG. 1A.

FIG. 3A shows yet a further multi layer printed circuit board 19 similar to the type of FIG. 2B without depicting the radiant source. The printed circuit board 19 is mounted with four electronic components 11 which are connected via thermally and electrically conductive vias 12 to a respective large area conductor path or conductor area 15 loaded with a electrical potential. The four conductor paths 15 are insulated electrically against each other. The isolated conductor layer 16 connected to the heat dissipating element 3 allows for the heat dissipation by means of convection.

Figure 3B:
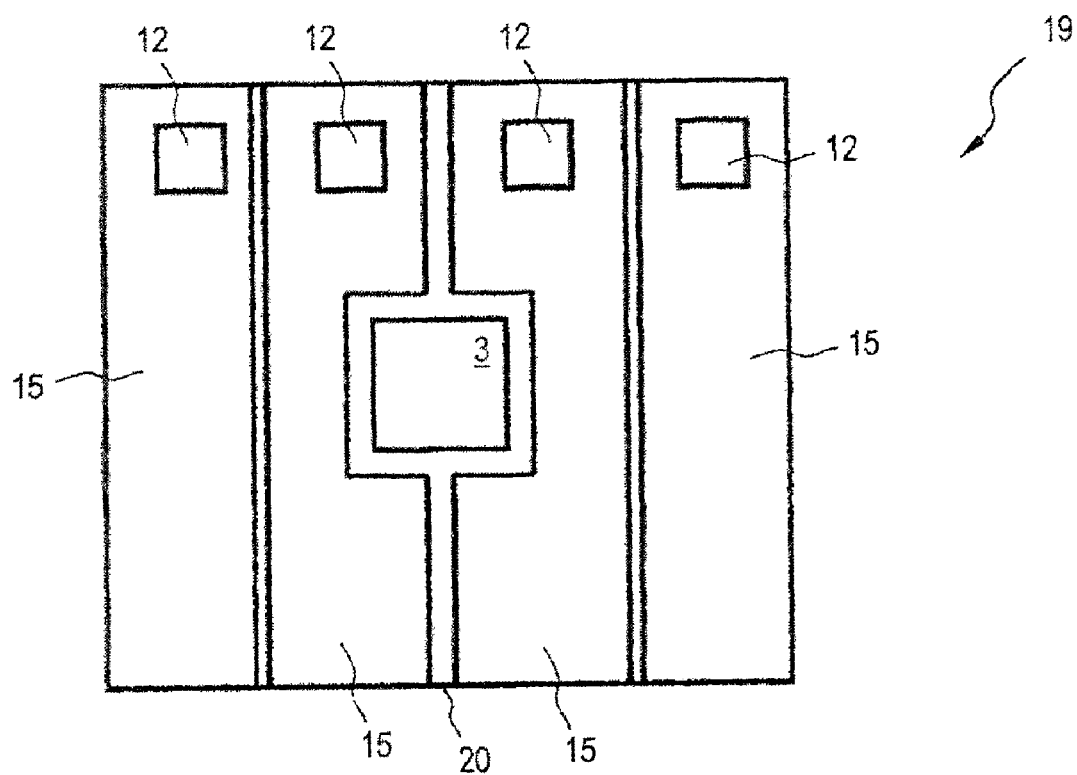
FIG. 3B shows a inner printed circuit board layer of the printed circuit board of FIG. 3A in top view.

FIG. 3B shows the printed circuit board layer of the printed circuit board 19 of FIG. 3A comprising conductor areas loaded with an electrical potential in top view. Each of the four conductor paths 15 has a contact area for the thermal via 12. The conductor paths 15 are electrically isolated against each other and from the heat dissipating element 3 via a gap on the substrate material 20 of FR4. The conductor paths 15 are formed with a large area in such a way that they fill the area provided on the printed circuit board layer to a maximum, in particular each of the conductor paths 15 has an equal size of area.

In the embodiment according to FIG. 3A and FIG. 3B the layers or conductor paths 15, 16, respectively, are to be formed with an area as large as possible to achieve a ideal heat spreading and hence a low thermal resistance between component and heat dissipating element 3 (inlay). With multiple components 11 it is sufficient to electrically separate the intermediate layer 15 loaded with a electrical potential. The layer 16 connected to the inlay 3 may be used in a shared manner.

Figure 4A:
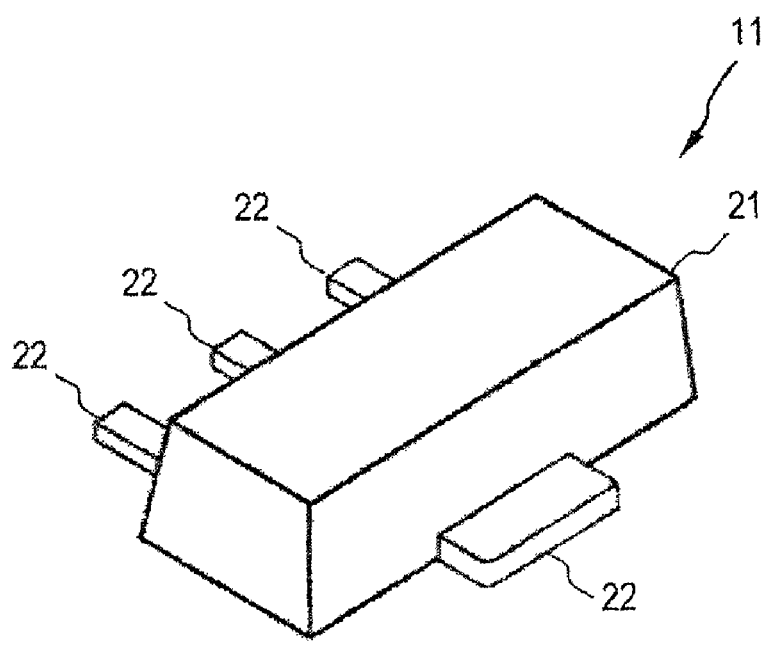
FIG. 4A shows a electronic component for attachment onto a printed circuit board in angular view from above.

FIG. 4A shows in an angular view from above an electronic component 11 for mounting particularly onto one of the above described printed circuit boards. The component 11 has a plastic housing 21 and three contacts 22 on the lower surface.

Figure 4B:
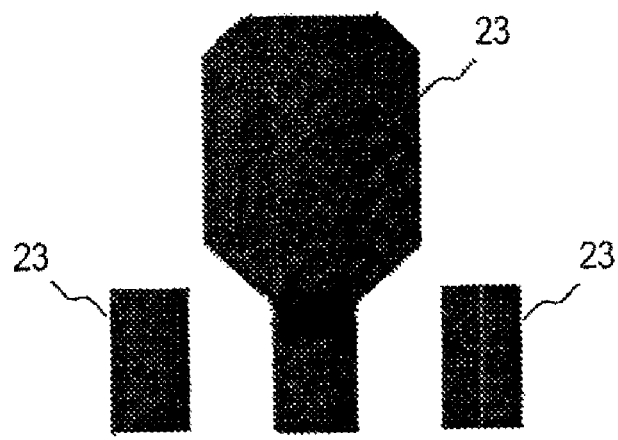
FIG. 4B shows a contact tab for the electronic component of FIG. 4A in top view.

FIG. 4B shows contact tabs 23 of the outer side 5 of the printed circuit board in top view, which are associated with the electrical contacts 22 for the electronic component of FIG. 4A.

Figure 5A:
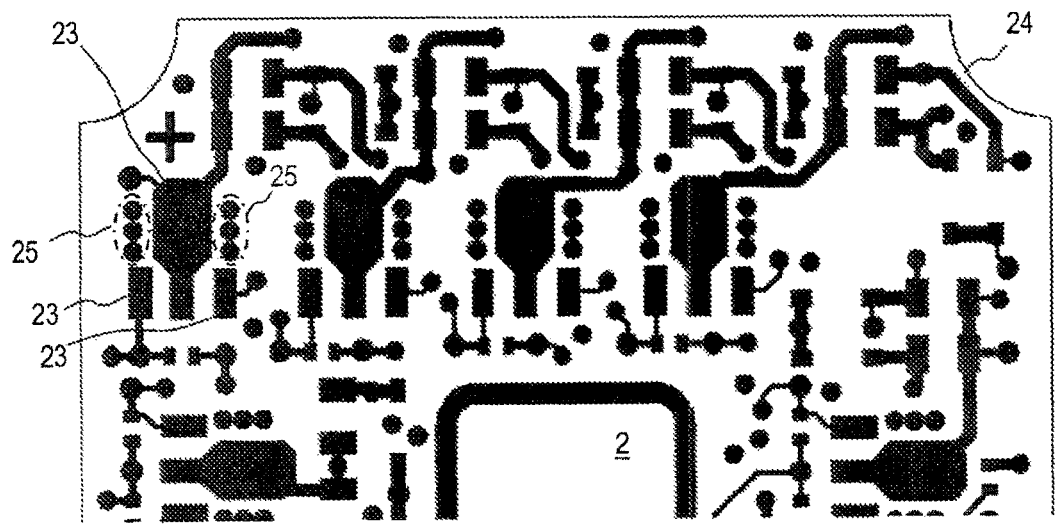
FIG. 5A shows a half of a layout of an outer layer of a printed circuit board according to an embodiment in top view.
Figure 5B:
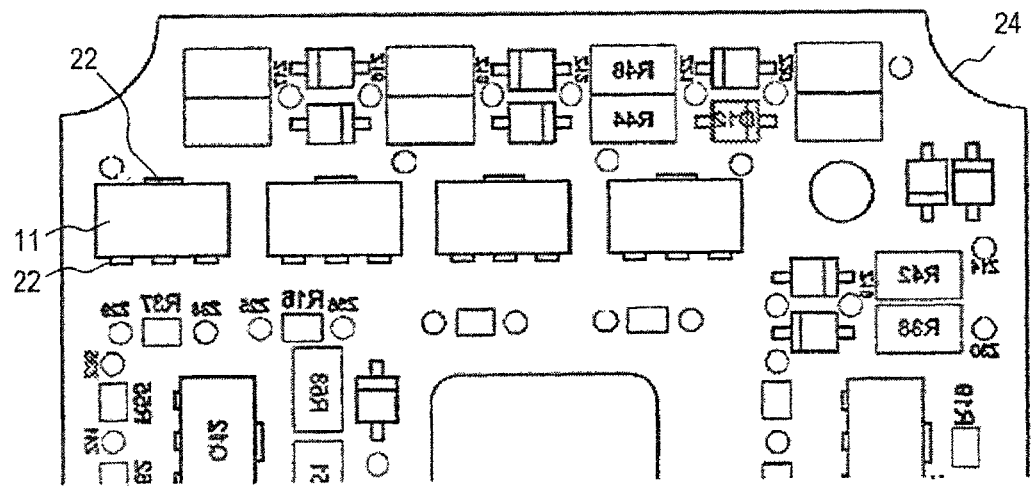
FIG. 5B shows the half of the outer layer of the printed circuit board of FIG. 5A with mounting in top view.

FIG. 5A shows an upper half of a layout of an outer layer of a printed circuit board 24 in top view. This layout is designed for six driver components according to FIG. 4A. Areas shown in black color are electrically conductive, areas shown in white color are electrically insulating. The printed circuit board 24, besides with contact tabs 23 (only described for one electronic component as an example), is also provided with two respective associated groups of thermal vias 25 which end at the surface. The via hole 2 formed quadratic with chamfered corners is electrically isolated against the layer. With a populated surface, as shown in FIG. 5B, the electronic components 11 with the contact tabs 23 are electrically and thermally contacted. The housing 2 is arranged across the exterior end faces of the thermal vias 25. In doing so the housing 21 may bear on the vias 25 in a contacting or not contacting manner.

Figure 6A:
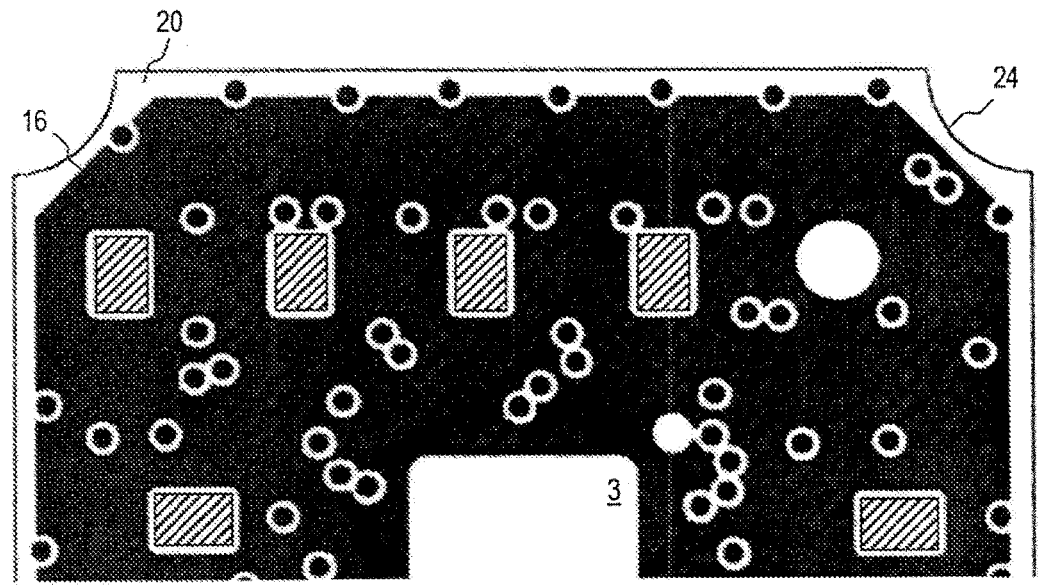
FIG. 6A shows a half of a layout of a first isolated inner layer of the printed circuit board of FIG. 5A in top view.

FIG. 6A shows the next lower conductor path layer of the printed circuit board 24. This conductor path layer is isolated and is arranged electrically conductive all the way to the recess 2 for the heat dissipating element. Plotted as a dotted line are thermal and electrical feed throughs or vias 12, respectively, which contact the contact tabs 23 of FIG. 5A at the lower side and pass electrically isolated through the conductor path layer shown.

Figure 6B:
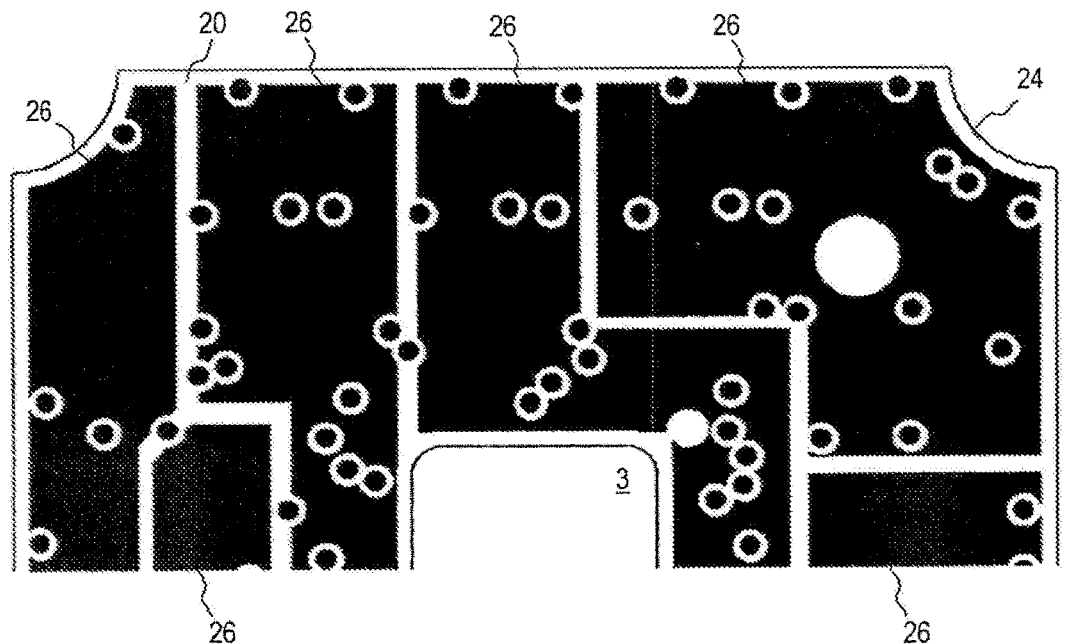
FIG. 6B shows a half of a layout of a second isolated inner layer of the printed circuit board of FIG. 5A in top view.

FIG. 6B shows in top view a half of a layout of a second conductor path layer of the printed circuit board 24 now connected to a electrical potential, which lies below the isolated conductor path layer of FIG. 6A. This corresponds to the basic configuration shown in FIG. 2D. Each of the six driver components 11 is connected to a large area conductor path 26 which may be loaded with a individual voltage potential. The conductor paths 26 fill the layer two-dimensionally to a maximum and are electrically isolated against the via hole 2.

During operation of the printed circuit board 24 shown in FIGS. 5A to 6B heat developed by the driver components 11 first is dissipated via the middle electrical contact tab 23 and further via the electrical and thermal vias to the conductor path layer comprising the large area conductor paths 26. There the heat is distributed and by means of convection is further transferred through the printed circuit board substrate 20 to the above arranged isolated printed circuit board and to hole 2 comprising the force fitted heat dissipating element therein. Secondly, heat developed at housing 21 is transferred via the thermal vias 25 and directly onto the isolated printed circuit board and to hole 2 comprising the force fitted heat dissipating element 3 therein. With the help of these two heat dissipation paths an efficient and compact heat dissipation is achieved.

For a better clarity not all of the conductor path layers and conductors of the printed circuit board 24 are shown.

Possible applications comprise a usage of the printed circuit board, or of multiple such printed circuit boards, for headlamps of vehicles (automotive headlamp modules), for stage and movie lighting, overall illumination or also for usage in retrofit lamps. When using infrared spotlights, for example IR-LEDs, possible applications comprise infrared cameras, for example for surveillance, for example for monitoring buildings, or automotive spotlights for infrared street lighting.

Naturally, the present invention is not limited to the exemplary embodiments shown. Such the cross-sectional form of the feed through hole is not limited and may for example be polygonal or round, for example circular or oval, may be existent with or without chamfered corners, or as a free-form surface. The material of the heat conducting elements in the via hole may for example be metallic or ceramic. The radiant source may be mounted onto the heat dissipating element directly or by means of the submounts, for example may be bonded or soldered. The radiant source(s) may/can be attached to the printed circuit board via solder connection, plug-in connection or wirebond connection. Also, the LEDs may generally be connected to a metallic or otherwise thermally as well as electrically well conducting heat dissipating element via a heat interface material with high thermal conductivity and low electrical conductivity. In addition, a heat conducting element may be used which only contacts the via hole in sections. Furthermore, the height of the heat dissipating elements may also be greater or smaller than the height of the printed circuit board. Other base materials for the printed circuit boards are feasible, for example FR1-FR5. Also, multiple via holes with respective, if necessary differently formed heat dissipating elements are feasible.

NUMERALS 1 printed circuit board
2 via hole
3 heat dissipating element
4 top surface
5 submount
6 light emitting diode
6A amber LED
6R red LED
6G green LED
6B blue LED
7 lower surface
8 bonding wire
9 heat dissipating element
10 printed circuit board
11 electronic component
12 thermal via
13 conductor path
14 printed circuit board
15 conductor path
16 conductor path
17 printed circuit board
18 printed circuit board
19 printed circuit board
20 substrate material 21 housing
22 electrical contacts
23 contact tab
24 printed circuit board
25 thermal via
26 conductor path
d distance

The invention claimed is:

1. A printed circuit board comprising:
at least one via hole, in which a heat dissipating element is arranged, the heat dissipating element having an opening with a first dimension;
at least one radiant source arranged on the heat dissipating element;
a heat conducting as well as electrically insulating submount for the at least one radiant source;
the submount having a second dimension which is larger than the first dimension;
wherein the heat dissipating element is electrically conductive and is separated from the at least one radiant source by means of the submount,
wherein the submount is attached by a force fit into the heat dissipating element;
wherein the printed circuit board is realized with multiple layers;
wherein at least one conductor path of at least one layer contacts the heat dissipating element.

2. The printed circuit board according to claim 1, wherein the heat dissipating element comprises a heat conducting as well as an electrically insulating material.

3. The printed circuit board according to claim 2, wherein the at least one radiant source is mounted directly onto the heat dissipating element.

4. The printed circuit board according to claim 1, wherein the radiant source comprises at least one light emitting diode.

5. The printed circuit board according to claim 4, wherein the radiant source comprises at least one group of light emitting diodes.

6. The printed circuit board according to claim 1,
wherein the conductor path contacted with the heat dissipating element is connected to an outer side of the printed circuit board by means of at least one heat conducting plated through hole,
wherein the heat conducting plated through hole contacting the conductor path is covered by a housing of an electronic component at the outer layer, wherein the electronic component does not cover the heat dissipating element.

7. The printed circuit board according to claim 1, wherein at least one conductor path of at least one layer does not contact the heat dissipating element.

8. The printed circuit board according to claim 7, wherein the conductor path not contacting the heat dissipating element is realized with a large area.

9. The printed circuit board according to claim 7, wherein at least one conductor path of at least one layer does not contact the heat dissipating element and wherein a conductor path not contacting the heat dissipating element and a conductor path contacting the heat dissipating element have a marginal distance, wherein a distance between a conductor path not contacting the heat dissipating element and a adjacent conductor path contacting the heat dissipating element does not exceed 250 μm.

10. The printed circuit board according to claim 7, wherein at least one conductor path of at least one layer does not contact the heat dissipating element and wherein a conductor path not contacting the heat dissipating element and a conductor path contacting the heat dissipating element have a marginal distance, where a distance between a conductor path not contacting the heat dissipating element and a adjacent conductor path contacting the heat dissipating element does not exceed 200 μm.

11. The printed circuit board according to claim 7, wherein at least one conductor path of at least one layer does not contact the heat dissipating element and wherein a conductor path not contacting the heat dissipating element and a conductor path contacting the heat dissipating element have a marginal distance, wherein a distance between a conductor path not contacting the heat dissipating element and a adjacent conductor path contacting the heat dissipating element does not fall below 25 μm.

12. The printed circuit board according to claim 7, wherein at least one conductor path of at least one layer does not contact the heat dissipating element and wherein a conductor path not contacting the heat dissipating element and a conductor path contacting the heat dissipating element have a marginal distance, where a distance between a conductor path not contacting the heat dissipating element and a adjacent conductor path contacting the heat dissipating element does not fall below 50 μm.

13. The printed circuit board according to claim 7, wherein a conductor path not contacting the heat dissipating element is designed to be connected to an electrical potential.

14. The printed circuit board according to claim 7, wherein a conductor path not contacting the heat dissipating element is connected to an electrical terminal of an electronic component via at least one electrically and thermally conductive plated through hole.

15. The printed circuit board according to claim 14, wherein the heat dissipating element contacts a wall of the associated plated through hole.

16. The printed circuit board according to claim 15, wherein the heat dissipating element is force fitted into the associated plated through hole.

17. The printed circuit board according to claim 1, wherein a thickness of a conductor path does not exceed 200 or 250 μm.

18. The printed circuit board according to claim 1, wherein a conductor path contacting the heat dissipating element is designed isolated.

19. The printed circuit board according to claim 1, wherein the heat dissipating element has a height corresponding to the height of the printed circuit board.

20. The printed circuit board according to claim 1, wherein the heat dissipating element is thermally contactable with a cooling system.

21. The printed circuit board according to claim 20, wherein the heat dissipating element is thermally contactable with the cooling system at a face averted to the at least one radiant source.

22. A lighting device comprising:
at least one printed circuit board having at least one via hole, in which a heat dissipating element is arranged, the heat dissipating element having an opening with a first dimension;
at least one radiant source arranged on the heat dissipating element;
a heat conducting as well as electrically insulating submount for the at least one radiant source;
the submount having a second dimension which is larger than the first dimension wherein the heat dissipating element is electrically conductive and is separated from the at least one radiant source by means of the submount, wherein the submount is attached by a force fit into the heat dissipating element;

wherein the printed circuit board is realized with multiple layers;

wherein at least one conductor path of at least one layer contacts the heat dissipating element.

* * * * *